(12) United States Patent
Xu et al.

(10) Patent No.: US 10,916,634 B2
(45) Date of Patent: Feb. 9, 2021

(54) METHOD OF FABRICATING A FLASH MEMORY

(71) Applicant: UNITED MICROELECTRONICS CORP., Hsin-Chu (TW)

(72) Inventors: Wei Xu, Singapore (SG); Wenbo Ding, Singapore (SG); Yu-Yang Chen, Singapore (SG); Wang Xiang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/417,542

(22) Filed: May 20, 2019

(65) Prior Publication Data

US 2020/0373164 A1 Nov. 26, 2020

(51) Int. Cl.
*H01L 21/28* (2006.01)
*H01L 27/11563* (2017.01)
*H01L 21/033* (2006.01)

(52) U.S. Cl.
CPC .... *H01L 29/40117* (2019.08); *H01L 21/0332* (2013.01); *H01L 21/0337* (2013.01); *H01L 27/11563* (2013.01)

(58) Field of Classification Search
CPC ......... H01L 29/40117; H01L 29/42344; H01L 27/11563
See application file for complete search history.

(56) References Cited

U.S. PATENT DOCUMENTS 5,824,584 A 10/1998 Chen
2004/0135192 A1 7/2004 Kasuya

*Primary Examiner* — John A Bodnar
(74) *Attorney, Agent, or Firm* — Winston Hsu

(57) ABSTRACT

A method of fabricating a semiconductor device includes forming a memory gate and a hard mask layer on the memory gate, forming a select gate on a sidewall of the memory gate and the hard mask layer, performing a selective oxidation process to form an oxide layer on the hard mask layer and the select gate, wherein a portion of the oxide layer on the select gate is thicker than a portion of the oxide layer on the hard mask layer, and removing the oxide layer on the hard mask layer and the hard mask layer to expose a top surface of the memory gate.

10 Claims, 3 Drawing Sheets

METHOD OF FABRICATING A FLASH MEMORY

BACKGROUND OF THE INVENTION

1. Field of the Invention

The present invention generally relates to a method of fabricating a flash memory, and more particularly, to a method for preventing etch damage on select gates in a flash memory.

2. Description of the Prior Art

Flash memory is classified as non-volatile memory (NVM) because a memory cell in the flash memory can retain the data stored in the memory cell without periodic refreshing. Most flash memory in prior art can store a single bit in a memory cell. In other words, the memory cell can either store a "one" or a "zero".

A split-gate memory cell is a type of non-volatile memory cell in which a select gate is placed adjacent to a memory gate. During programming of a split-gate memory cell, the select gate is biased at a relatively low voltage, while only the memory gate is biased at a high voltage to provide a vertical electric field necessary for hot-carrier injection. Since acceleration of carriers takes place in the channel region mostly under the select gate, the relatively low voltage on the select gate results in more efficient carrier acceleration in the horizontal direction compared to a conventional flash memory cell. This makes hot-carrier injection more efficient with lower current and lower power consumption during programming operations. A split-gate memory cell may be programmed using techniques other than hot-carrier injection. Depending on the technique, advantages over the conventional flash memory cell during programming operations may vary.

In the fabrication of the split-gate memory cell, the oxide-nitride (ON) spacer isolating between the memory gate and select gate and the select gate itself may be easily damaged by common etching processes in the process for removing nitride mask layer on the memory gate. This damage issue may influence the breakdown voltage between the memory gate and select gate and cause high current leakage. On the other hand, if the etching process is tuned to prevent the over-etching on the ON spacer and select gate, the nitride residue may remain on the memory gate and impact on the electrical property of memory due to incomplete removal. Accordingly, there is a need for a memory device and methods for preventing the damage of spacers and select gates in order to maintain the performance and reliability of the memory device.

SUMMARY OF THE INVENTION

In order to solve the aforementioned process issue in prior art, the present invention hereby provide a novel method of fabricating a flash memory free from etch damage without requiring significant design change or excessive process cost.

One objective of the present invention is to provide a method of fabricating a semiconductor device, including the steps of forming a memory gate and a hard mask layer on the memory gate, forming a select gate on a sidewall of the memory gate and the hard mask layer, performing a selective oxidation process to form an oxide layer on the hard mask layer and the select gate, wherein a portion of the oxide layer on the select gate is thicker than a portion of the oxide layer on the hard mask layer, and removing the oxide layer on the hard mask layer and the hard mask layer to expose a top surface of the memory gate.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
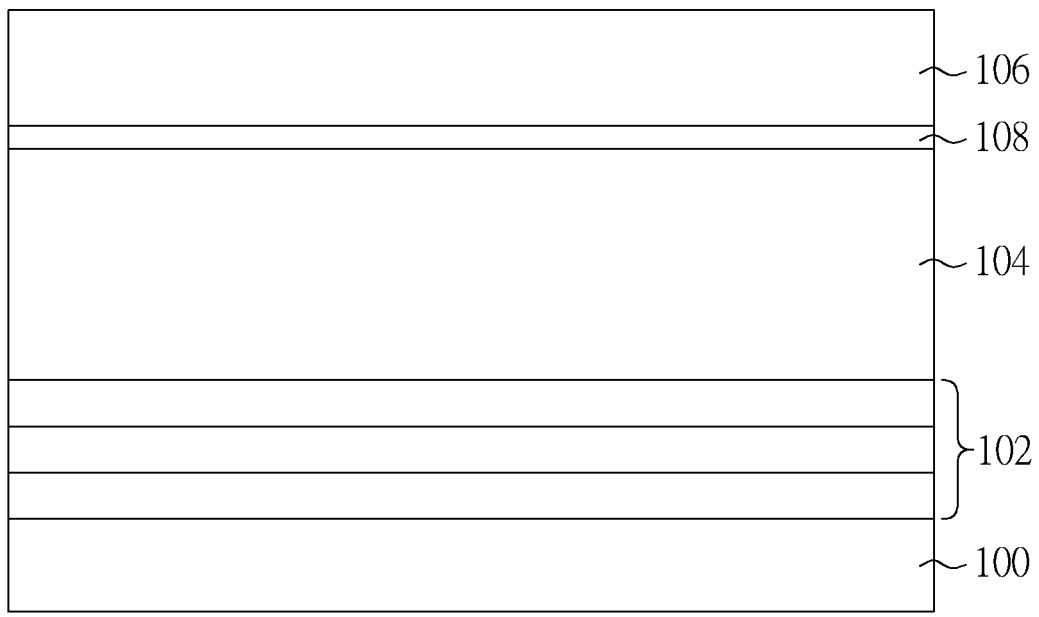
FIG. 1 to FIG. 5 are schematic cross-sections illustrating the process flow of fabricating a flash memory in accordance with the preferred embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Before describing the preferred embodiment in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete. The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "forming," "form," "deposit," or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

FIG. 1 to FIG. 5 are schematic cross-sections illustrating the process flow of fabricating a flash memory in accordance with the preferred embodiment of the present invention. First, please refer to FIG. 1. Memory cell/device is formed preliminarily on a substrate 100, such as a silicon substrate. Substrate 100 is commonly p-type or a p-type well while the doped source/drain regions (not shown) are n-type. However, it is also possible for substrate 100 to be n-type while the source/drain regions are p-type.

The substrate 100 may be divided into cell regions and peripheral region, wherein the cell region is used for forming memory components such as memory gates and select gates, while high-voltage (HV) and/or logic circuitry may be formed in peripheral regions. The cell regions, the peripheral regions and/or the semiconductor devices formed on each region may be isolated from each other by shallow trench isolation (STI). The drawing of the present invention is focused on the memory components formed on the cell region. The features, structures and components formed on the peripheral region will not be shown in figures.

Refer still to FIG. 1. A microcircuit element such as a memory cell or memory structure is to be fabricated having a charge trapping layer 102, a gate conducting layer 104 and a hard mask layer 106 formed on the semiconductor substrate 100. The charge trapping layer 102 is generally an oxide/nitride/oxide tri-layer stack collectively and commonly referred to as "ONO" structure, which commonly serves as a charge trapping dielectric by including a charge trapping silicon nitride layer sandwiched between two silicon dioxide layers. The gate conducting layer 104 is formed on the charge trapping layer 102. Any appropriate gate conductor material such as polysilicon could be used to form the gate conducting layer 104, according to a preferred embodiment.

The gate conductor layer 104 may be formed or disposed according to any appropriate well-known method such as deposition. Deposition can comprise any process that grows, coats, or transfers material onto a substrate. Some well-known technologies include physical vapor deposition (PVD), chemical vapor deposition (CVD), electro-chemical deposition (ECD), molecular beam epitaxy (MBE), atomic layer deposition (ALD), and plasma-enhanced CVD (PECVD), amongst others.

The hard mask layer 106 is disposed over the gate conductor layer 104. The hard mask layer 106 may comprise any suitable material that allows for selective removal (e.g., etching) of the unmasked portion of the gate conductor layer 104. According to the preferred embodiment, the hard mask layer 106 is a silicon nitride (SiN) layer or a silicon carbon nitride (SiCN) layer. In addition, an etch stop layer 108 may be formed between the gate conducting layer 104 and the hard mask layer 106. The material of etch stop layer 108 may be silicon oxide, which has etch selectivity to the nitride based hard mask layer 106 formed thereon, in order to be used in later hard mask removing process.

Figure 2:
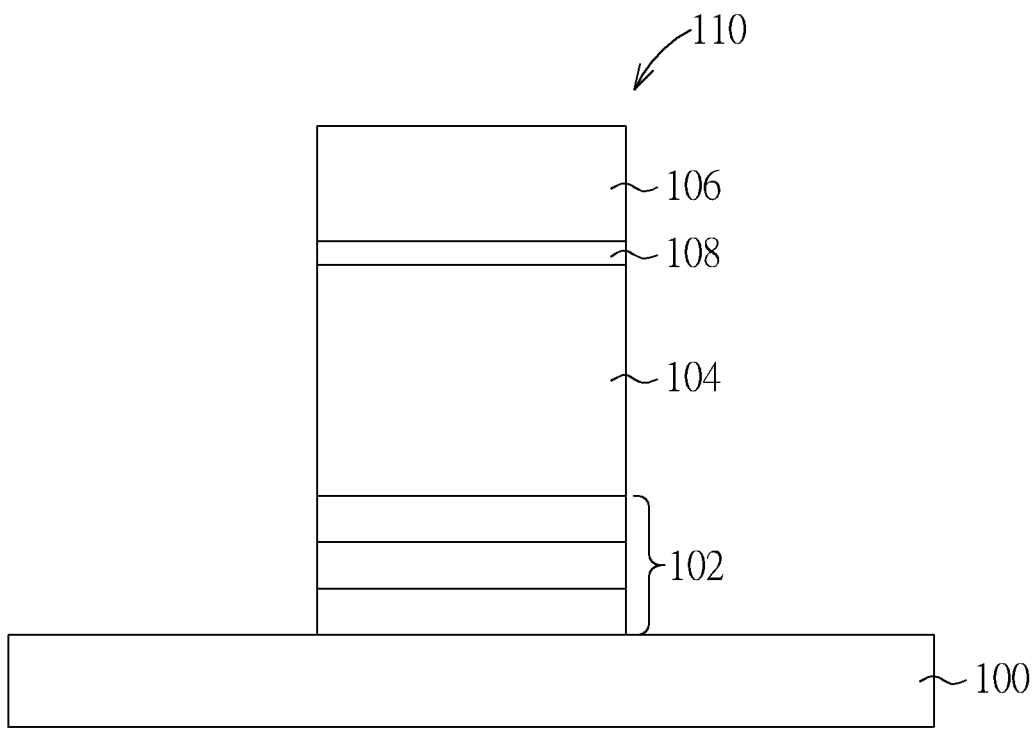

Refer to FIG. 2, the hard mask layer 106, the etch stop layer 108, the gate conducting layer 104 and the charge trapping layer 102 are patterned to create a memory gate 110. This patterning process may comprise several conventional steps. For example, the hard mask layer 106 may be first patterned into a hard mask with gate features using photoresist. An etching process is then performed with the hard mask as an etch mask to pattern the gate conducting layer 104 and the charge trapping layer 102 into a memory gate 110. In case of blurring and confusing the key points of the present invention, the above detailed steps of patterning process are not depicted in drawings and the memory gate 110 is consequently presented in FIG. 2.

Figure 3:
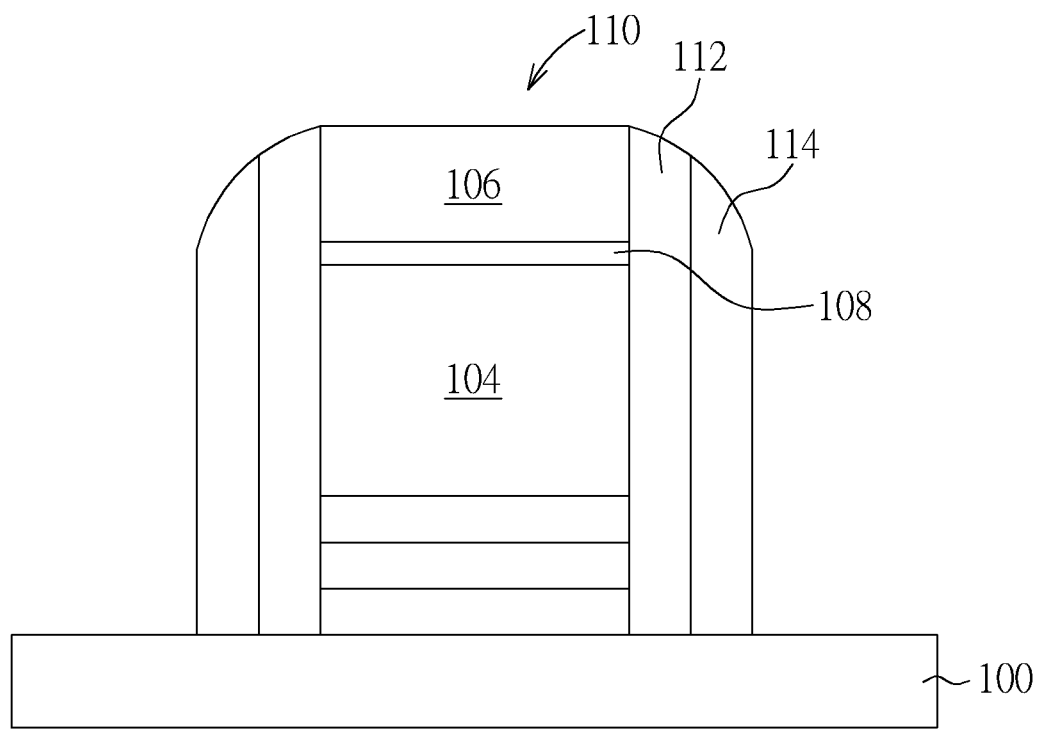

Refer now to FIG. 3. Spacers 112 are formed on sidewalls of the memory gate 110. According to the preferred embodiment, the spacer 112 is a silicon oxide layer. Alternatively, in another embodiment, the spacer 112 may comprise one or more layers of dielectric such as oxide-nitride (ON), which is referred to as an ON spacer. The formation of spacer 112 may comprise several conventional steps. For example, an oxide layer may be first formed conformally on the memory gate 110 and the substrate 100 by well-known deposition method. The deposited, conformal oxide layer is then subjected to an etching process. The etching process would remove the portion of the oxide layer formed on the horizontal plane (above the top surface of hard mask layer 106), thus only the portion of the oxide layer formed on sidewalls of the memory gate 110 remains and forms spacer profile. Similarly, the ON spacer may be formed by the same process as described above. Please note that in the embodiment, the spacer 112 may be substantially level with the hard mask layer 106 of memory gate 110 and higher than the gate conducting layer 104 of memory gate 110.

Refer still to FIG. 3. Select gates 114 are formed respectively on the sidewalls of spacers 112, wherein the spacer 112 interfaces between the memory gate 110 and the select gate 114. The formation of the select gate 108 may comprise several conventional steps. For example, a gate conductor layer (not shown) is first formed over the memory gate 110 and the substrate 100. The gate conductor layer may be formed of any suitable conductor, such as polysilicon. After deposition of the gate conductor layer, the gate conductor layer may be removed from all portions of the memory gate 110 except the portion on the sidewall of spacer 112 according to well-known methods. The select gate 114 formed by the removal of these portions is substantially taper-shaped as shown in FIG. 3. In case of blurring and confusing the key points of the present invention, the above detailed steps of forming select gates 114 are not depicted in drawings and the select gate structure is consequently presented in FIG. 3.

Figure 4:
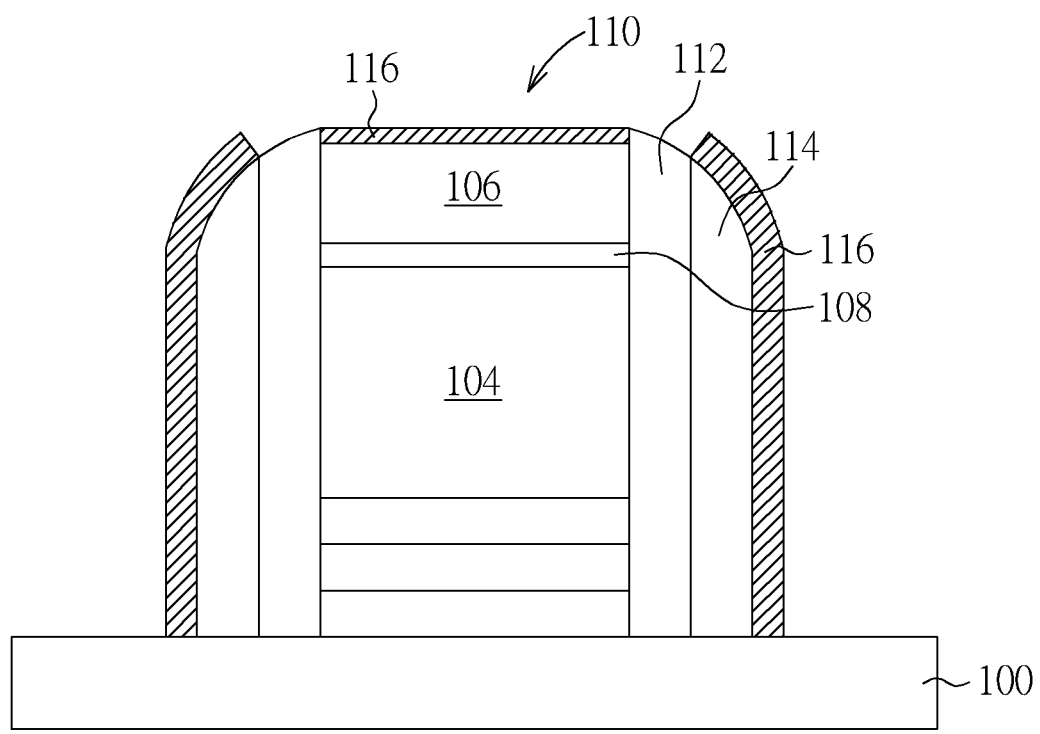

Refer to FIG. 4, it shows a step of performing an oxidation process to form an oxide layer 116 on the memory device, generally by means of a rapid thermal oxidation process. The oxide layer 116 is formed to cover exposed surfaces of the hard mask layer 106 and the select gate 114. In the present invention, the thermal oxidation process is preferably a dry oxidation process. In comparison to conventional wet oxidation process such as in-situ steam generation (ISSG), the dry oxidation process has higher growing selectivity for the material layer where the oxide layer 116 grown from. For example, please note that the portion of oxide layer 116 formed on the polysilicon-based select gate 114 is thicker than the portion of oxide layer 116 formed on the nitride-based hard mask layer 106, and the oxide-based spacer 112 has nearly no oxide layer 116 formed thereon in this oxidation process, since it is already an oxide layer.

Figure 5:
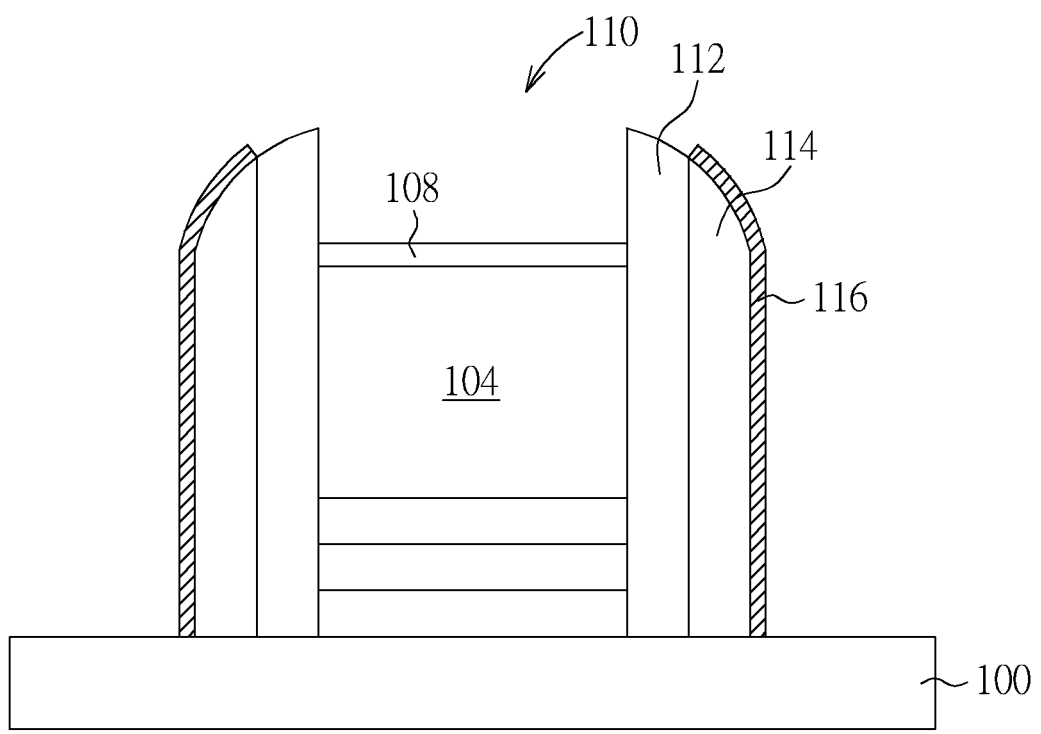

The non-uniform film thickness of oxide layer 116 on different portions of the memory device has great benefit for the removal of hard mask layer 106 in later process of the present invention. Please refer now to FIG. 5. After the oxide layer 116 is formed, an etch process is performed to remove the hard mask layer 106 of the memory gate 110. According to the present invention, this etch process may include several steps: (1) using diluted hydrofluoric acid (DHF) to remove the thinner oxide layer 116 on the hard mask layer 106 and expose the surface of hard mask layer 106. Please note that this step may also partially remove the thicker oxide layer 116 on the select gate 114, so that the thicker oxide layer 116 on the select gate 114 is thinned as shown in FIG. 5, but still remains on the select gate 114 to provide the protective effect for the select gate 114; (2) using phosphoric acid ($H_3PO_4$) to remove the nitride-based hard mask layer 106 until the etch stop layer 108 thereunder is exposed. In this step, the oxide layer 116 remaining on the select gate 114 would protect the select gate 114 and prevent it from being damaged by the etchant for removing the hard mask layer 106.

In a conventional process where the oxide layer 116 is formed by wet oxidation process, the oxide layer 116 would be formed with even thickness, no matter on the nitride-based hard mask layer 106 or on polysilicon-based select gate 114. Therefore, in a conventional process of removing hard mask layer 106, the oxide layer 116 on the select gate 114 would be completely removed rather than thinned, like the one on the hard mask layer 106, so that the select gate 114 will be exposed and not protected from the etch process. On the other hand, if the etching process is tuned to prevent the over-etching on the select gate 114, the hard mask residue would easily remain on the gate conducting layer 104 of the memory gate 110 due to incomplete removal and impact on the electrical property of memory device. In comparison to conventional approaches, through the formation of selective oxide layer 116 with uneven thickness on different portions in the present invention, the hard mask layer 106 may be selectively and completely removed without damaging the select gate 114 that is completely enclosed by the remaining oxide layer 116 and the spacer 112, thus the electrical performance and the reliability of the finally fabricated memory device are therefore well-maintained or sustained. After the hard mask layer 106 is remove, the top of spacer 112 and the select gate 114 would be higher than and protrude above the memory gate 110.

In addition, after the hard mask layer 106 is removed, an ashing and a Caroz clean process are performed to remove polymers, such as the photoresist layer (not shown) covered on the unmasked regions that are not to be etched or the polymer remaining from previous processes. Please note that the aforementioned etch process for removing the hard mask layer 106 may be, but not limited to, a dry etch process, a wet etch process, a wet clean process or the combination thereof.

In later processes, impurity layers (not shown) may be formed as source/drain in the semiconductor substrate 100 by ion implantation with n-type impurities, and a metal, such as titanium and cobalt, for forming silicide may be deposited over the entire surface. The silicide layer (not shown) is formed on the exposed surface of the semiconductor substrate 100 by subjecting the metal formed on the semiconductor substrate to a silicidation reaction.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
   providing a substrate;
   forming a memory gate on said substrate and a hard mask layer on said memory gate;
   forming an oxide spacer on a sidewall of said memory gate and said hard mask layer;
   forming a select gate on a sidewall of said oxide spacer, wherein said oxide spacer is between said select gate and said sidewall of said memory gate and said hard mask layer;
   performing a selective oxidation process to form an oxide layer on said hard mask layer and said select gate, wherein a portion of said oxide layer on said select gate is thicker than a portion of said oxide layer on said hard mask layer; and
   performing an etch process to completely remove said portion of said oxide layer on said hard mask layer and said hard mask layer to expose a top surface of said memory gate.

2. The method of fabricating a semiconductor device of claim 1, wherein said portion of said oxide layer on said select gate is thinned by said etch process and remains on said select gate.

3. The method of fabricating a semiconductor device of claim 1, wherein said etch process comprises a dry etch process, a wet clean process or the combination thereof.

4. The method of fabricating a semiconductor device of claim 1, wherein said oxide layer is not formed on said oxide spacer.

5. The method of fabricating a semiconductor device of claim 1, wherein said oxide layer and said oxide spacer completely surround said select gate.

6. The method of fabricating a semiconductor device of claim 1, wherein said selective oxidation process is rapid thermal process.

7. The method of fabricating a semiconductor device of claim 1, further comprising forming an etch stop layer between said hard mask layer and said memory gate.

8. The method of fabricating a semiconductor device of claim 1, further comprising forming an oxide-nitride-oxide trilayer between said substrate and said memory gate.

9. The method of fabricating a semiconductor device of claim 1, a material of said select gate comprises polysilicon.

10. The method of fabricating a semiconductor device of claim 1, a material of said hard mask layer comprises silicon nitride.

\* \* \* \* \*